United States Patent
Wu et al.

(10) Patent No.: US 7,772,923 B2
(45) Date of Patent: Aug. 10, 2010

(54) TEST CIRCUIT FOR PROGRAMMABLE GAIN AMPLIFIER

(75) Inventors: Po-Chiang Wu, Hsinchu County (TW); Chia-Liang Chiang, Taipei Hsien (TW); Sheng-Nan Chiu, Hsinchu (TW); Chung-Ting Yang, Taoyuan County (TW); Ying-Chuan Peng, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 12/464,846

(22) Filed: May 12, 2009

(65) Prior Publication Data
US 2009/0284312 A1    Nov. 19, 2009

(30) Foreign Application Priority Data
May 13, 2008    (TW)    ............................... 97117604 A

(51) Int. Cl.
*G01R 19/00* (2006.01)

(52) U.S. Cl. .......................................... 330/2; 330/278

(58) Field of Classification Search ..................... 330/2, 330/98, 150, 254, 278
See application file for complete search history.

(56) References Cited

U.S. PATENT DOCUMENTS

| 5,557,237 A * | 9/1996 | Carpentier .................. 330/129 |
| 6,580,232 B2 * | 6/2003 | Gries et al. ............ 315/368.21 |
| 7,265,626 B2 * | 9/2007 | Teo et al. .................... 330/279 |

* cited by examiner

*Primary Examiner*—Henry K Choe
(74) *Attorney, Agent, or Firm*—Winston Hsu

(57) ABSTRACT

A test circuit, for checking whether at least one programmable gain amplifier (PGA) operates correctly, includes a signal generator, a gain controller, a test level output circuit, a comparison circuit and an identifying circuit. The signal generator is utilized for outputting a test input signal to a PGA to generate a test output signal. The gain controller is utilized for outputting a gain control signal to the PGA to adjust a gain of the PGA. The test level output circuit is utilized for referring to the test output signal to output a first test level and a second test level. The comparison circuit is utilized for comparing the first and second test levels to generate a result signal. The identifying circuit is utilized for identifying whether the PGA operates correctly according to the result signal.

12 Claims, 4 Drawing Sheets

TEST CIRCUIT FOR PROGRAMMABLE GAIN AMPLIFIER

BACKGROUND OF THE INVENTION

1. Field of the Invention

The present invention relates to a test circuit, and more particularly, to a test circuit for checking whether at least one programmable gain amplifier (PGA) operates correctly.

2. Description of the Prior Art

In conventional practice, an extra test device is required for checking a mixed signal integrated circuit (IC). FIG. 1 is a diagram illustrating a conventional test device for an audio codec 10. To determine whether the audio codec 10 operates correctly, the conventional test method utilizes an analog to digital converter (ADC) and a digital signal processor (DSP), both of which are external to the audio codec 10. First, the ADC converts an analog output of the audio codec 10 into digital information. Then, the DSP performs a calculation on a plurality of digital information to get an average value. The average value is compared with a predetermined value to determine whether the audio codec 10 operates correctly.

To make the test result more reliable, it is necessary to lengthen the test time. However, the test efficiency decreases proportionally as the test time gets longer.

SUMMARY OF THE INVENTION

It is therefore one of the objectives of the present invention to provide a test circuit, which utilizes a test level output circuit, a comparison circuit and an identifying circuit to check if a PGA operates correctly.

According to an exemplary embodiment of the present invention, a test circuit is disclosed. The test circuit comprises a signal generator, a gain controller, a test level output circuit, a comparison circuit and an identifying circuit. The signal generator is coupled to a PGA, and is for outputting a test input signal to the PGA. The PGA generates a test output signal according to the test input signal. The gain controller is coupled to the PGA, and is for outputting a gain control signal to the PGA to adjust a gain of the PGA. The test level output circuit is coupled to the PGA, and is utilized for referring to the test output signal to output a first test level and a second test level. The comparison circuit is coupled to the test level output circuit, and is for comparing the first test level and the second test level to generate a result signal. The identifying circuit is coupled to the comparison circuit, and is for identifying whether the PGA operates correctly according to the result signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
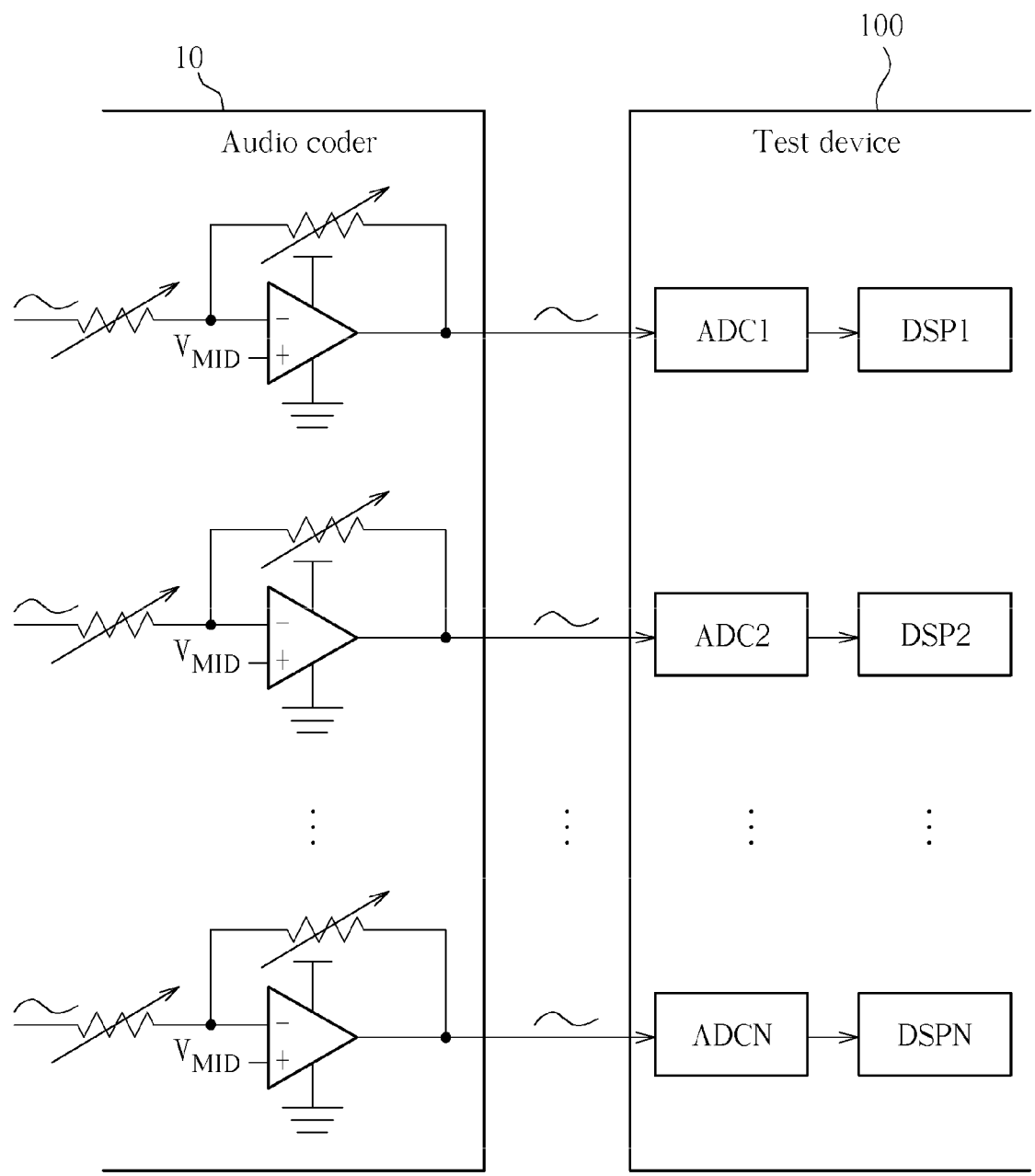
FIG. 1 is a diagram illustrating a conventional test device for an audio codec.
Figure 2:
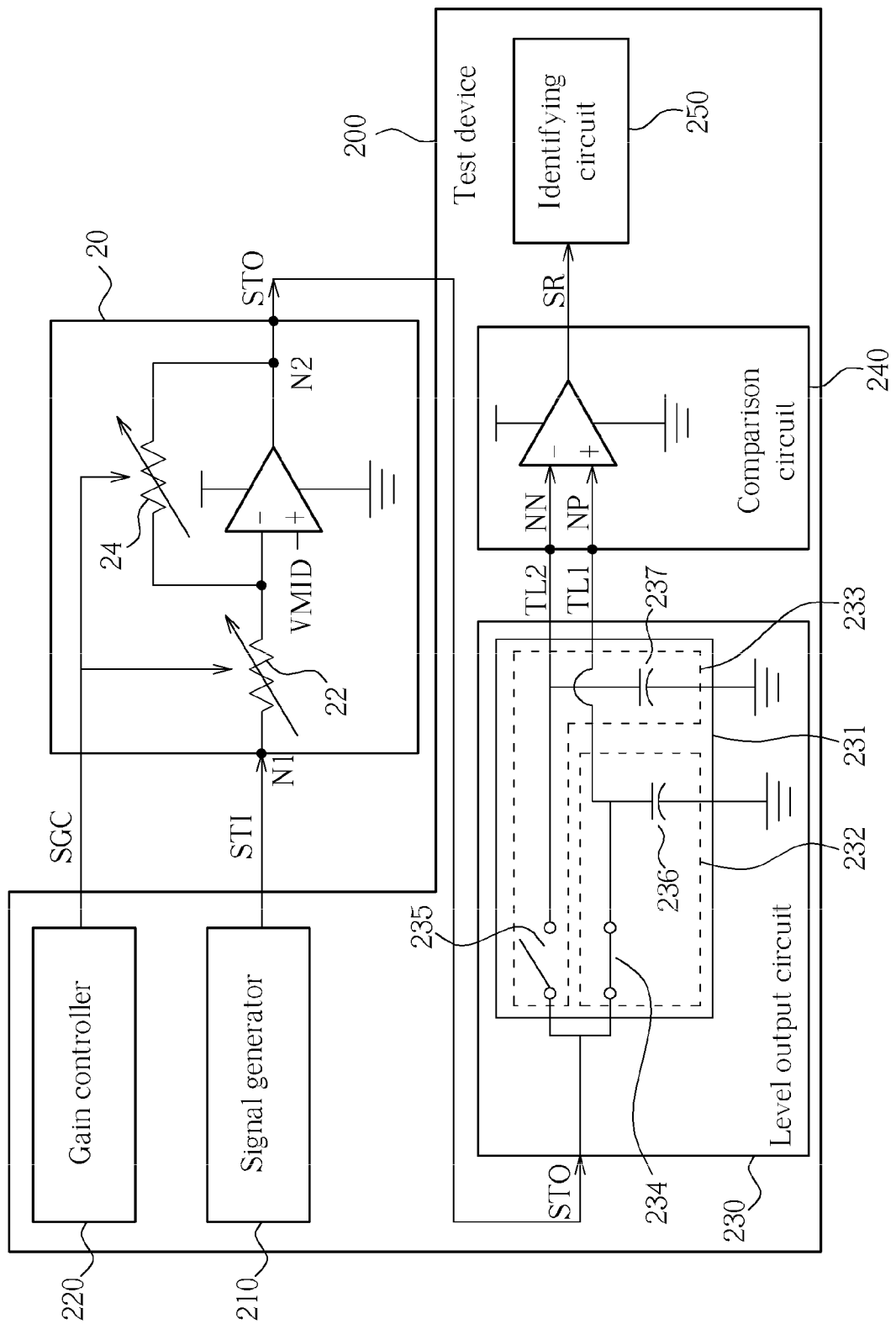
FIG. 2 is a diagram illustrating a test circuit according to an embodiment of the present invention.

Please refer to FIG. 2. FIG. 2 is a diagram illustrating a test circuit 200 according to an embodiment of the present invention. The test circuit 200 is utilized to check if a PGA 20 operates correctly. As shown in FIG. 2, the test circuit 200 comprises a signal generator 210, a gain controller 220, a test level output circuit 230, a comparison circuit 240 and an identifying circuit 250. The signal generator 210 is coupled to an input node N1 of the PGA 20, and is for outputting a test input signal ST1 into the PGA 20. The gain controller 220 is coupled to a first variable resistor 22 and a second variable resistor 24 in the PGA 20, and is for outputting a gain control signal SGC into the PGA 20 to change either or both resistances of the first and second variable resistors 22, 24 so as to adjust a gain of the PGA 20. Since use of the first and second variable resistors 22, 24 for adjusting the gain of the PGA 20 is well known to those skilled in the art, further description is omitted here for brevity. The test level output circuit 230 is coupled to an output node N2 of the PGA 20, and is for referring a test output signal STO from the PGA 20 to output a first test level TL1 and a second test level TL2. The test output signal STO is varied with the gain of the PGA 20. The comparison circuit 240 is coupled to the test level output circuit 230, and is for comparing the first test level TL1 and the second test level TL2 to generate a result signal SR. The identifying circuit 250 is coupled to the comparison circuit 240, and is for identifying whether the PGA 20 operates correctly according to the result signal SR. Further description of the test circuit 200 is detailed as follows; however, this description is merely for greater clarity of understanding, and should not be taken as limiting the present invention.

Figure 3:
FIG. 3 is a diagram illustrating a test input signal and a test output signal.

The signal generator 210 and the gain controller 220, as previously described, respectively output the test input signal ST1 and the gain control signal SGC into the PGA 20, and the PGA 20 generates the test output signal STO according to the test input signal ST1 and the gain control signal SGC. Please refer to FIG. 3. FIG. 3 is an exemplary diagram illustrating the test input signal ST1 and the test output signal STO. In this embodiment, the input signal ST1 is a DC level signal, and the gain of the PGA 20 is adjusted by the gain control signal SGC to increase with time. In this case, the voltage level of the test output signal STO should increase with time when the PGA 20 operates correctly. Please note this is for illustrative purposes and is not a limitation of the present invention. In other embodiments, the gain controller 220 may output gain control signals with different design patterns to adjust the gain of the PGA 20. For example, the gain controller 220 may output a gain control signal SGC with a different design pattern than in the above embodiment to adjust the gain of the PGA 20 so as to make the voltage level of the test output signal STO decrease with time. As can be seen from the above, the gain of the PGA 20 can be adjusted by the control pattern of the gain control signal SGC outputted from the gain controller 220. Since this technology is well known to those skilled in the art and is not a key point of the present invention, further description is not detailed here.

The test level output circuit 230, as previously described, outputs the first and second test levels TL1, TL2 according to the test output signal STO received from the test level output circuit 230. Please refer to FIG. 2 again. The test level output circuit 230 comprises a buffering circuit 231, as shown in FIG. 2. The buffering circuit 231 is for buffering a reference level data D according to the test output signal STO, and is for referring the reference level data D to determine the first and second test levels TL1, TL2. In this embodiment, the buffering circuit 231 comprises a first buffering unit 232 and a second buffering unit 233, which are for providing the first and second test levels TL1, TL2, respectively. The first buffering unit 232 has a first switch 234 and a first capacitor 236. The first switch 234 is coupled between the output node N2 of the PGA 20 and a first input node NP of the comparison circuit 240, and the first capacitor 236 is coupled between the output node N2 of the PGA 20, the first input node NP of the comparison circuit 240 and ground. When the first switch 234 is switched on, the first buffering unit 232 outputs the voltage level of the test output signal STO into the first input node NP of the comparison circuit 240 as the first test level TL1, and the voltage level of the test output signal STO is stored in the first capacitor 236 as the reference level data D; when the first switch 234 is switched off, the first buffering unit 232 outputs the reference level data D stored in the first capacitor 236 into the first input node NP of the comparison circuit 240 as the first test level TL1.

In a similar way, the second buffering unit 233 has a second switch 235 and a second capacitor 237. The second switch 235 is coupled between the output node N2 of the PGA 20 and a second input node NN of the comparison circuit 240, and the second capacitor 237 is coupled between the output node N2 of the PGA 20, the second input node NN of the comparison circuit 240 and ground. When the second switch 235 is switched on, the second buffering unit 233 outputs the voltage level of the test output signal STO into the second input node NN of the comparison circuit 240 as the second test level TL2, and the voltage level of the test output signal STO is also stored in the second capacitor 237 as the reference level data D; when the second switch 235 is switched off, the second buffering unit 233 outputs the reference level data D stored in the second capacitor 237 into the second input node NN of the comparison circuit 240 as the second test level TL2.

Figure 4:
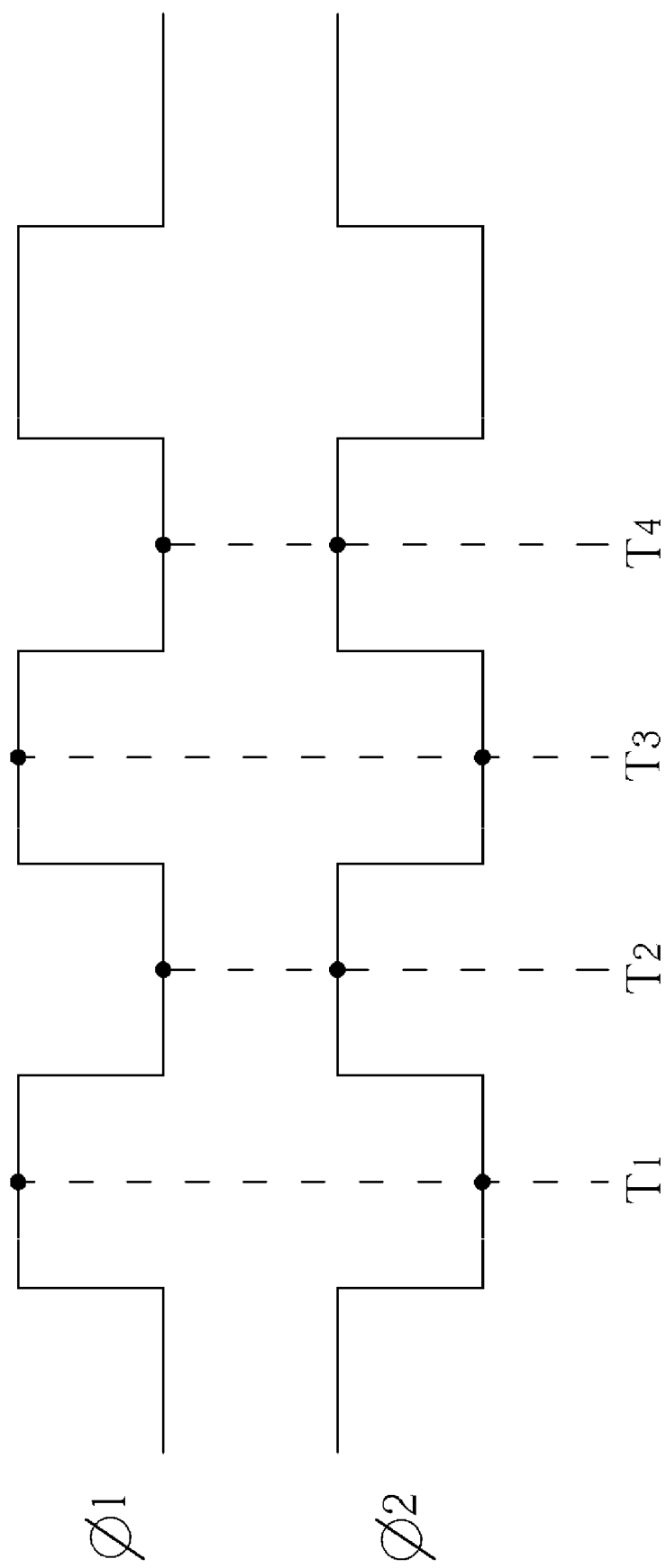
FIG. 4 is a timing diagram illustrating a relation between the first switch and the second switch.

In this embodiment, the first switch 234 and the second switch 235 are switched on alternately. Please refer to FIG. 4. FIG. 4 is a timing diagram illustrating a relation between the first switch 234 and the second switch 235. In FIG. 4, a first timing control signal ψ1 corresponds to the first switch 234, and a second timing control signal ψ2 corresponds to the second switch 235. As can be seen from FIG. 4, when the first timing control signal ψ1 is at a high level, the second timing control signal ψ2 is at a low level. In this situation, the first switch 234 is switched on and the second switch 235 is switched off (e.g., at T1, T3); and when the first timing control signal ψ1 is at a low level, the second timing control signal ψ2 is at a high level, the first switch 234 is switched off and the second switch 235 is switched on (e.g., at T2, T4).

Judging from the above, when the first switch 234 is switched on and the second switch 235 is switched off (e.g., at T1, T3), the voltage level of the first input node NP of the comparison circuit 240 (i.e., the first test level TL1) is updated continuously by the voltage level of the test output signal STO, and the voltage level of the second input node NN of the comparison circuit 240 stays at the voltage level of the test output signal STO when the second switch 235 is switched on (i.e., the reference level data D stored in the second capacitor 237). When the first switch 234 is switched off and the second switch 235 is switched on (e.g., at T2, T4), the voltage level of the second input node NN of the comparison circuit 240 (i.e., the first test level TL1) stays at the voltage level of the test output signal STO when the first switch 234 is switched on (i.e., the reference level data D stored in the first capacitor 236), and the voltage level of the first input node NP of the comparison circuit 240 is updated continuously by the voltage level of the test output signal STO. The comparison circuit 240, as previously described, compares the voltage levels of the first input node NP and the second input node NN of the comparison circuit 240 (i.e., the first and second test levels TL1, TL2) to output the result signal SR into the identifying circuit 250. The identifying circuit 250 identifies whether the PGA 20 operates correctly by identifying whether the result signal SR complies with an expected result. The expected result is based on the gain control signal SGC.

For example, in this embodiment, the voltage level of the test output signal STO should increase with time when the PGA 20 operates correctly. Thus, when the first switch 234 is switched on and the second switch 235 is switched off (e.g., at T1, T3), the voltage level of the first input node NP of the comparison circuit 240 is higher than the voltage level of the second input node NN of the comparison circuit 240. When the first switch 234 is switched off and the second switch 235 is switched on (e.g., at T2, T4), the voltage level of the second input node NN of the comparison circuit 240 is higher than the voltage level of the first input node NP of the comparison circuit 240. In other words, the voltage levels of the first and second input nodes NP, NN of the comparison circuit 240 are alternately higher than each other. The expected result is, therefore, a periodic square wave. Accordingly, the identifying circuit 250 is capable of identifying whether the PGA 20 operates correctly by simply checking if the result signal SR complies with the expected result.

In this embodiment, the signal generator 210, the gain controller 220, the test level output circuit 230 and the compare circuit 240 are all disposed in an audio codec; this is, however, for illustrative purposes and is not a limitation of the present invention. In practice, it is possible that only some devices out of the signal generator 210, the gain controller 220, the test level output circuit 230 and the compare circuit 240 are disposed in the same codec, or none of them are disposed in the codec.

In this embodiment, the test circuit 200 only checks the PGA 20; this is, however, for illustrative purposes and is not a limitation of the present invention. In a preferred embodiment of the present invention, the test circuit 200 can test a plurality of PGAs at the same time. When the test circuit 200 tests a plurality of PGAs at the same time, the gain controller 220 generates a plurality of gain control signals with different control patterns to ensure the test result accuracy. After reading the above-mentioned description, those skilled in the art should readily appreciate how to utilize the test circuit 200 to test a plurality of PGAs at the same time, and therefore further description is omitted here for the sake of brevity.

The conventional test method for PGA has high-complexity and time-inefficiency since extra circuits for performing numerical analysis, such as a DSP, have to be utilized. In contrast with the conventional method, the test circuit of the present invention checks the PGA by using relatively simple electronic components, such as switches, capacitors and comparators, so that the test efficiency is considerably increased.

Those skilled in the art will readily observe that numerous modifications and alterations of the device and method may be made while retaining the teachings of the invention.

What is claimed is:

1. A test circuit, for checking a programmable gain amplifier (PGA), comprising:
    a signal generator, coupled to the PGA, for outputting a test input signal to the PGA, wherein the PGA generates a test output signal according to the test input signal;
    a gain controller, coupled to the PGA, for outputting a gain control signal to the PGA to adjust a gain of the PGA, wherein the test output signal is varied with the gain of the PGA;
    a test level output circuit, coupled to the PGA, for referring the test output signal to output a first test level when the gain of the PGA is a first gain, and for referring the test output signal to output a second test level when the gain of the PGA is a second gain, wherein the first gain is different from the second gain;

a comparison circuit, coupled to the test level output circuit, for comparing the first test level and the second test level to generate a result signal; and an identifying circuit, coupled to the comparison circuit, for identifying whether the result signal complies with an expected result, wherein the expected result is based on the gain control signal.

2. The test circuit of claim 1, wherein the test input signal is a DC level signal.

3. The test circuit of claim 1, wherein the test level output circuit comprises a buffering circuit, for buffering a reference level data according to the test output signal, and for referring to the reference level data to determine the first test level and the second test level.

4. The test circuit of claim 3, wherein the buffering circuit comprises:
- a first buffering unit, for providing the first test level, having:
  - a first switch, coupled between an output node of the PGA and a first input node of the comparison circuit; and
  - a first capacitor, coupled to the first input node of the comparison circuit; and
- a second buffering unit, for providing the second test level, having:
  - a second switch, coupled between the output node of the PGA and a second input node of the comparison circuit; and
  - a second capacitor, coupled to the second input node of the comparison circuit;
- wherein the first switch and the second switch are switched on alternately, the first capacitor buffers the reference level data when the first switch is switched on, and the second capacitor buffers the reference level data when the second switch is switched on.

5. The test circuit of claim 1, wherein the signal generator, the gain controller, the test level output circuit and the compare circuit are all disposed in a codec.

6. The test circuit of claim 5, wherein the codec is an audio codec.

7. The test circuit of claim 1, wherein the gain controller outputs the gain control signal with different gain control patterns.

8. A method for checking a programmable gain amplifier (PGA), comprising:
- inputting a test input signal to the PGA, wherein the PGA generates a test output signal according to the test input signal;
- inputting a gain control signal to the PGA to adjust a gain of the PGA, wherein the test output signal is varied with the gain of the PGA;
- referring to the test output signal to output a first test level when the gain of the PGA is a first gain, and referring to the test output signal to output a second test level when the gain of the PGA is a second gain, wherein the first gain is different from the second gain;
- comparing the first test level and the second test level to generate a result signal; and
- identifying whether the result signal complies with an expected result, wherein the expected result is based on the gain control signal.

9. The method of claim 1, wherein the test input signal is a DC level signal.

10. The method of claim 8, further comprising:
- buffering a reference level data according to the test output signal, and referring to the reference level data to determine the first test level and the second test level.

11. The method of claim 10, wherein the step of buffering the reference level data according to the test output signal comprise:
- providing a first buffering unit, for providing the first test level having a first capacitor;
- providing a second buffering unit, for providing the second test level having a second capacitor; and
- coupling an output node of the PGA to the first capacitor and the second capacitor alternately;
- wherein the first capacitor buffers the reference level data when the output node of the PGA is coupled to the first capacitor; and the second capacitor buffers the reference level data when the output node of the PGA second switch is coupled to the second capacitor.

12. The method of claim 8, wherein the gain control signal has different gain control patterns.

* * * * *